(12) United States Patent
Pedrali et al.

(10) Patent No.: US 8,153,994 B2
(45) Date of Patent: Apr. 10, 2012

(54) COOLING SYSTEMS AND METHODS FOR GRAZING INCIDENCE EUV LIGHTOGRAPHY COLLECTORS

(75) Inventors: Marco Pedrali, Bergamo (IT); Riccardo Ghislanzoni, Ballabio (IT)

(73) Assignee: Media Lario S.R.L., Bosisio Parini (IT)

(*) Notice: Subject to any disclaimer, the term of this patent is extended or adjusted under 35 U.S.C. 154(b) by 358 days.

(21) Appl. No.: 12/592,736

(22) Filed: Dec. 2, 2009

(65) Prior Publication Data

US 2011/0128513 A1  Jun. 2, 2011

(51) Int. Cl.
*G21K 5/00* (2006.01)
(52) U.S. Cl. ...................... 250/492.1; 378/34
(58) Field of Classification Search ............... 250/492.1, 250/492.2, 504 R; 378/34
See application file for complete search history.

(56) References Cited

U.S. PATENT DOCUMENTS

| 5,768,339 A | 6/1998 | O'Hara |
| 2004/0109151 A1* | 6/2004 | Bakker et al. .................. 355/69 |
| 2007/0084461 A1 | 4/2007 | Box et al. |

FOREIGN PATENT DOCUMENTS

| WO | WO 01/08162 A1 | 2/2001 |
| WO | WO 2007/051638 A1 | 5/2007 |

* cited by examiner

*Primary Examiner* — Mark R Gaworecki
(74) *Attorney, Agent, or Firm* — Opticus IP Law PLLC

(57) ABSTRACT

A cooling system (10) for an extreme ultraviolet (EUV) grazing incidence collector (GIC) mirror assembly (240) having at least one shell (20) with a back surface (22) is disclosed. The cooling system has a plurality of spaced apart circularly configured cooling lines (30) arranged in parallel planes (PL) that are perpendicular to the shell central axis (AC) and that are in thermal contact with and that run around the back surface. Input and output secondary cooling-fluid manifolds (44, 46) are respectively fluidly connected to the plurality of cooling lines to flow a cooling fluid from the input secondary cooling-fluid manifold to the output cooling secondary fluid manifold over two semicircular paths for each cooling line. Separating the cooling fluid input and output locations reduces thermal gradients that can cause local surface deformations in the shell that can lead to degraded focusing performance.

35 Claims, 10 Drawing Sheets

COOLING SYSTEMS AND METHODS FOR GRAZING INCIDENCE EUV LIGHTOGRAPHY COLLECTORS

FIELD OF THE INVENTION

The present invention relates generally to grazing-incidence collectors (GICs), and in particular to cooling systems and methods for GICs used in extreme ultraviolet (EUV) lithography.

BACKGROUND ART

EUV lithography is anticipated to be the lithographic process of choice for producing future generations of semiconductor devices having linewidths on the order of 32 nm and smaller. The wavelength of the EUV radiation is nominally 13.5 nm, which calls for the use of specialized optics to collect and image the EUV radiation.

One type of EUV optical system used to collect the radiation from the light source is a grazing incidence collector (GIC). A GIC typically comprises one or more concentrically arranged shells configured to receive light from the EUV source at grazing incidence and reflect the light to form a focused illumination beam that first forms an intermediate focus and then creates an illumination region in the far field that is preferably uniform to within a specification set by the overall system optical design.

The light sources being considered for EUV lithography include a discharge-produced plasma (DPP) and laser-produced plasma (LPP). The conversion efficiency of these sources is only a few percent so that most of the energy used to generate the EUV radiation is converted to infrared, visible and UV radiation and energetic particles that can be incident upon the collector mirror. This radiation causes a substantial thermal load on the GIC mirror. Each GIC mirror shell therefore needs to be cooled so that the heat absorbed by the mirror does not substantially adversely affect GIC performance or damage the GIC.

Essentially all GICs for EUV lithography have been used to date only in the laboratory or for experimental "alpha" systems under very controlled conditions. As such, there has been little effort directed to GIC cooling systems for use in a commercially viable EUV lithography system. In fact, the increasing demand for higher EUV power also increases the thermal load on the GIC. Consequently, more efficient and effective thermal management and cooling systems must be implemented to minimize the optical distortion due to the thermal load.

SUMMARY OF THE INVENTION

An aspect of the invention is a cooling system for an EUV GIC having at least one shell with a back surface and a central axis. The cooling system includes a plurality of spaced apart substantially circular cooling lines arranged in substantially parallel planes that are substantially perpendicular to the shell central axis. The cooling lines are in thermal contact with and run around a corresponding circumference of the back surface. The system also has input and output cooling-fluid manifolds respectively fluidly connected to the plurality of cooling lines at spaced apart input and output locations to flow a cooling fluid from the input cooling-fluid manifold to the output cooling-fluid manifold over two paths for each cooling line. In one example, the cooling-line paths are substantially semicircular.

Another aspect of the invention is an EUV lithography system for illuminating a reflective mask. The EUV lithography system includes a source of EUV radiation and a GIC collector having the above-described cooling system, wherein the GIC collector is configured to receive EUV radiation and form collected EUV radiation. The system also includes an illuminator configured to receive the collected EUV radiation and form condensed EUV radiation for illuminating the reflective mask.

Another aspect of the invention is a method of cooling a GIC shell having a back surface and a central axis. The method includes providing a cooling fluid to a plurality of cooling fluid input locations adjacent the shell back surface. The method also includes guiding the cooling fluid over a portion of the shell back surface via a plurality of separate pairs of substantially semicircular paths in substantially parallel planes that are substantially perpendicular to the central axis and in thermal contact with the shell back surface to a corresponding plurality of cooling fluid output locations adjacent the shell back surface and located substantially 180° from the cooling fluid input locations.

Another aspect of the invention is a method of forming a GIC shell having a backside and a central axis. The method includes providing the shell on a mandrel, and then providing a cooling assembly having a plurality of substantially circularly configured cooling lines arranged in substantially parallel planes that are substantially perpendicular to the shell central axis. Each cooling line has a pair of substantially semicircular sections defined by cooling fluid input and output locations. The method also includes disposing the cooling assembly such that the cooling lines contact the shell back surface. The method then involves electroforming the cooling lines to the shell back surface, and then removing the shell and the attached cooling assembly from the mandrel.

Another aspect of the invention is a method of collecting EUV radiation from an EUV radiation source. The method includes arranging, relative to the EUV radiation source, a GIC mirror system having at least one GIC shell. The method also includes cooling the at least one GIC shell with the cooling method as described above and as described in greater detail below. The method further includes using the GIC mirror system to reflect the EUV radiation from the EUV radiation source to an intermediate focus.

It is to be understood that both the foregoing general description and the following detailed description present embodiments of the invention, and are intended to provide an overview or framework for understanding the nature and character of the invention as it is claimed. The accompanying drawings are included to provide a further understanding of the invention, and are incorporated into and constitute a part of this specification. The drawings illustrate various embodiments of the invention and together with the description serve to explain the principles and operations of the invention.

Figure 1:
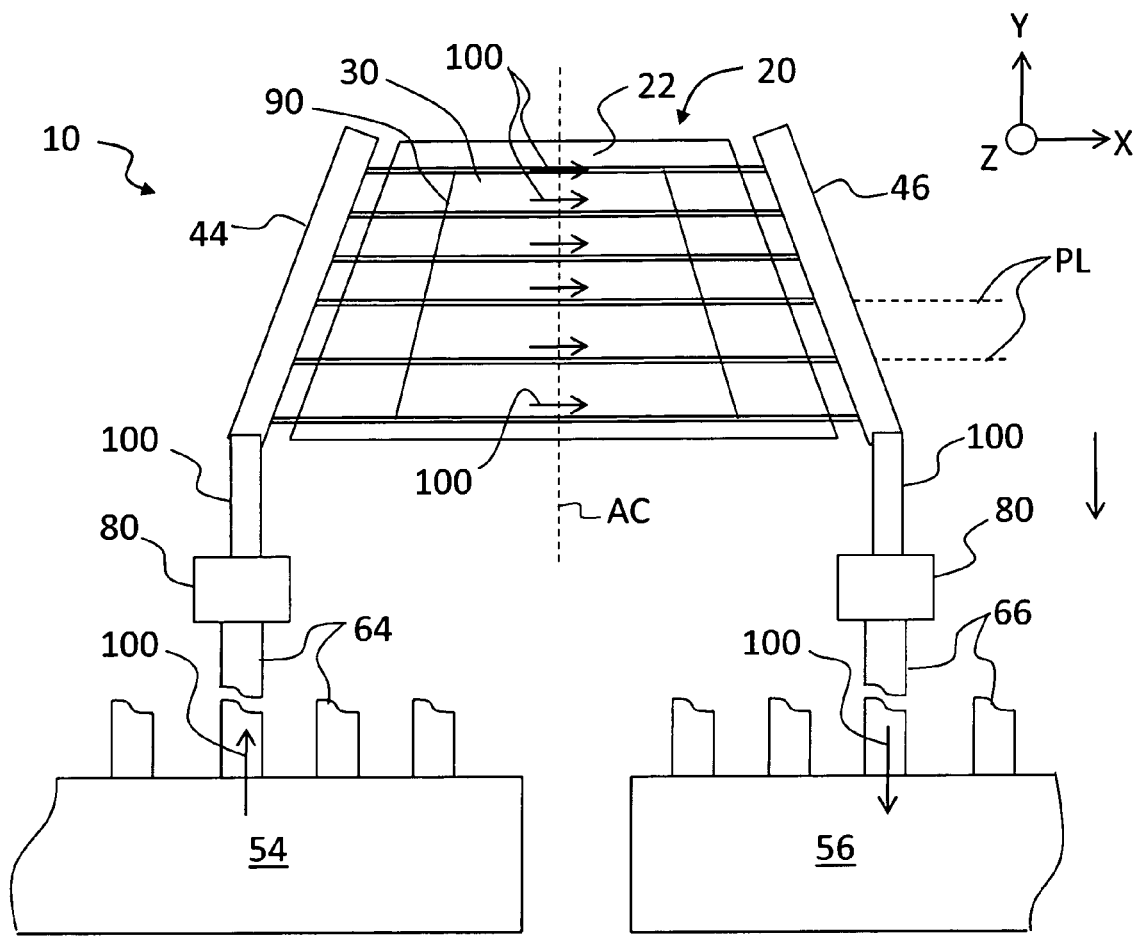
FIG. 1 is a schematic diagram of embodiment of a GIC shell cooling system for cooling a GIC shell.

The various elements depicted in the drawing are merely representational and are not necessarily drawn to scale. Certain sections thereof may be exaggerated, while others may be minimized. The drawing is intended to illustrate an example embodiment of the invention that can be understood and appropriately carried out by those of ordinary skill in the art.

DETAILED DESCRIPTION OF THE INVENTION

FIG. 1 is a schematic diagram of embodiment of a GIC shell cooling system ("system") 10 for cooling a GIC shell 20. Multiple GIC shell cooling systems 10 along with their corresponding GIC shell 20 can be combined to form a cooled GIC mirror system ("GIC mirror") 240 as described in greater detail below.

Figure 2:
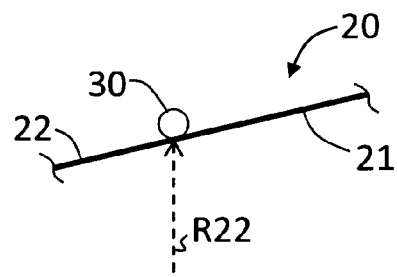
FIG. 2 is a partial schematic view of an example GIC shell showing how the GIC shell varies in radius as a function of axial position.

GIC shell 20 has an inner surface 21 (see FIG. 2 and FIG. 3), a back surface 22 and a central axis AC. A Cartesian coordinate system is shown in FIG. 1 and subsequent Figures for the sake of reference. GIC shell 20 is typically axially symmetric so that back surface 22 typically has an associated radius R22 that varies with position along central axis AC, as illustrated in the partial schematic view of FIG. 2.

System 10 includes a plurality of spaced apart cooling lines 30 that are disposed relative to GIC shell back surface 22 so as to be in thermal communication therewith. In an example embodiment, cooling lines 30 include nickel (e.g., nickel tubing) and can have a round or non-round (e.g., oblate or oval) cross-sectional shape. An example cooling line outside diameter is in the range from about 5 mm to about 6 mm. In example embodiments, at least some of cooling lines 30 have a different diameter.

Figure 3:
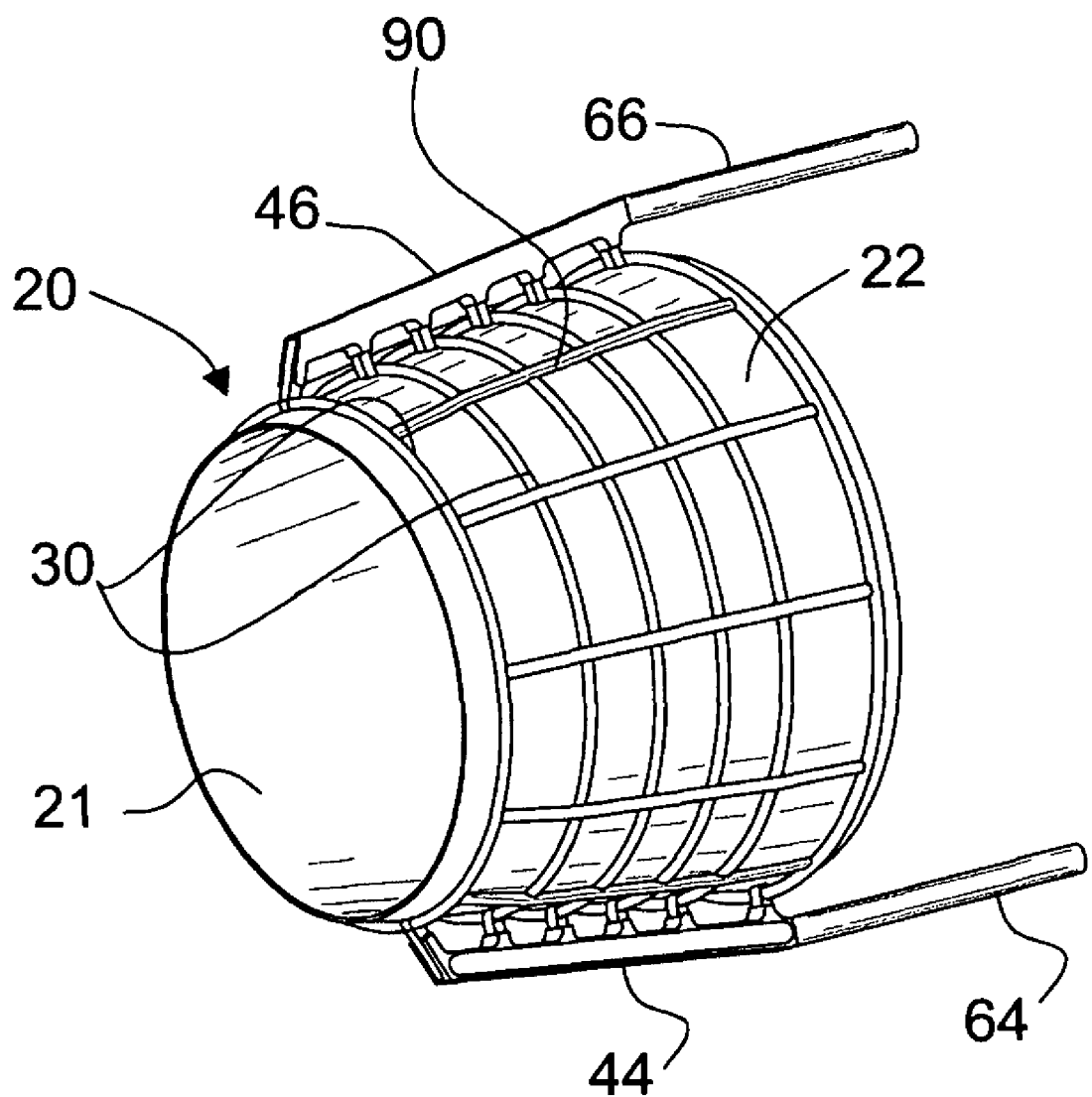
FIG. 3 is a perspective view of an example GIC shell with parallel cooling lines and cooling line supports arranged on the back surface of the GIC shell and perpendicular to the cooling lines.
Figure 4A:
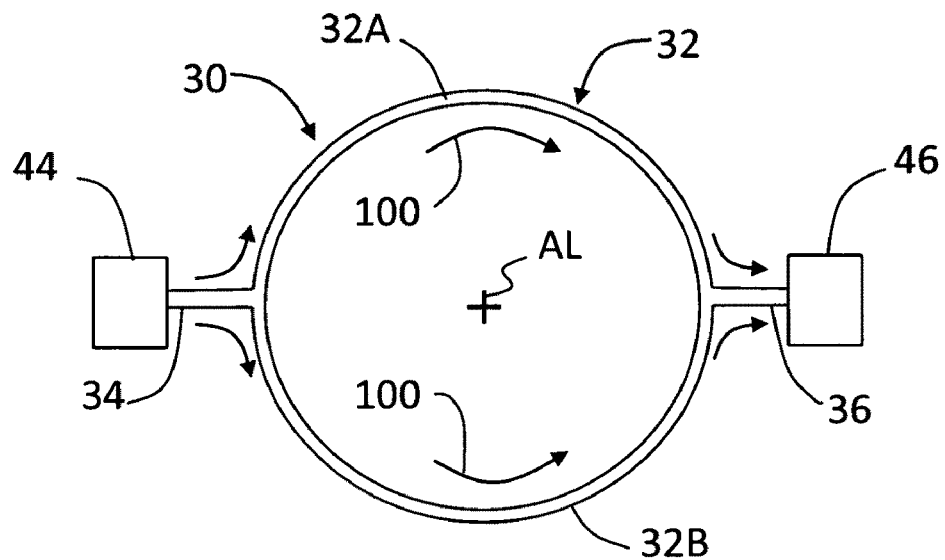
FIG. 4A is a schematic diagram of an example cooling line without the GIC shell present, illustrating the two substantially semicircular cooling line sections and the substantially 180° arrangement of the cooling fluid input and output locations.

Cooling lines 30 are arranged in substantially parallel planes PL that are substantially perpendicular to shell central axis AC so that each cooling line traverses the circumference of the GIC shell 20 at a given radius. FIG. 3 is a perspective view of an example GIC shell 20 with cooling lines arranged on back surface 32, and FIG. 4A is a schematic diagram of an example cooling line 30 without GIC shell 20. Cooling line 30 has a center AL and first and second substantially semicircular sections 32A and 32B that define semicircular cooling fluid flow paths. Cooling line 30 also includes respective input and output sections 34 and 36 located substantially 180° apart from each other and that define the first and second cooling line substantially semicircular sections 32A and 32B. In an example embodiment, input and output sections 34 and 36 each consist of an alloy brazed connection rather than sections of cooling line. Input and output sections 34 and 36 define respective input and output locations where cooling fluid 100 is inputted and outputted from the corresponding cooling line 30.

System 10 further includes input and output cooling-fluid manifolds 44 and 46 arranged adjacent shell surface 22. Input and output cooling-fluid manifolds 44 and 46 are configured to connect to multiple input and output sections 34 and 36 associated with the multiple cooling lines 30 for the given GIC shell so that cooling fluid can flow from the input manifold to the cooling lines and then to the output manifold.

Figure 4B:
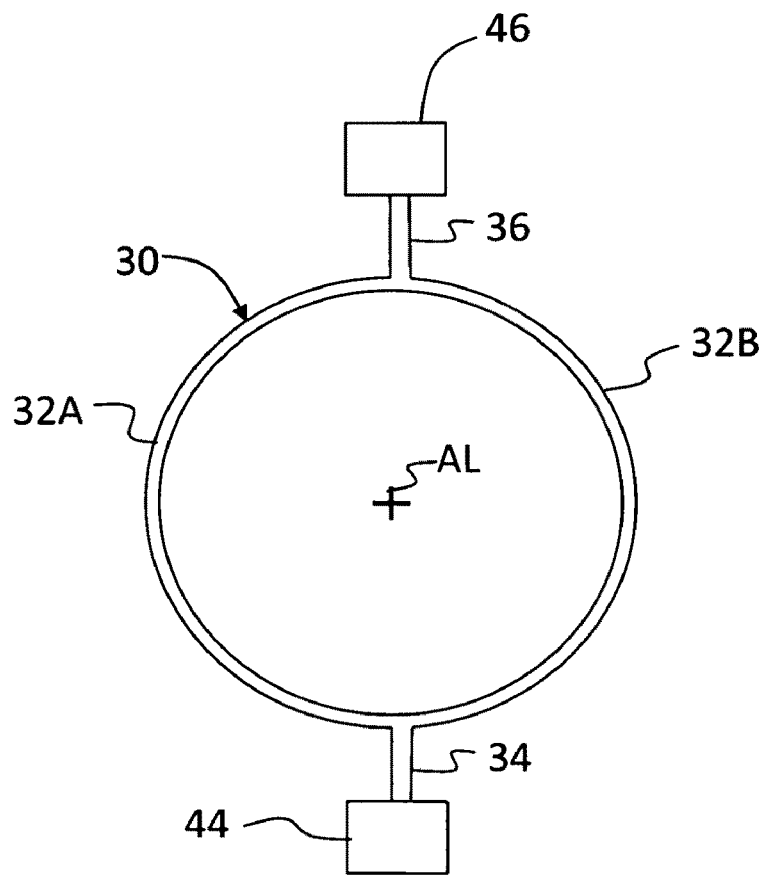
FIG. 4B is similar to FIG. 4A and shows an example adjacent cooling line to that of FIG. 4A and connected to a second set of input and output cooling-fluid manifolds in an embodiment where two sets of input and output cooling-fluid manifolds are used for a given set of cooling lines.

In an example embodiment, a given GIC shell 20 may have two sets of input and output cooling fluid manifolds 44 and 46, with one set connecting to "even" cooling lines 30 and the other set connecting to "odd" cooling lines. In one example, the two sets of input and output cooling-fluid manifolds 44 and 46 are located about 90° from each other. This configuration is used, for example, when there are a relatively large number of tightly spaced cooling lines 30. FIG. 4B is similar to FIG. 4A and illustrates an example cooling line 30 and input and output cooling-fluid manifolds 44 and 46 that might be located adjacent the cooling line and input and output cooling-fluid manifolds of FIG. 4A, with the input and output cooling-fluid manifolds 44 and 46 of the adjacent cooling lines being located 90° apart while the input and output cooling-fluid manifolds 44 and 46 associated with each cooling line 30 are located about 180° apart.

Input and output cooling-fluid manifolds 44 and 46 can be thought of as "secondary" manifolds that are respectively connected to input and output main cooling-fluid manifolds 54 and 56 via respective input and output feeder lines 64 and 66. An example outside diameter of the feeder lines is 11 mm. Input and output main manifolds 54 and 56 are configured to connect to multiple input and output feeder (connecting) lines 64 and 66 for the different GIC shells 20 of a multi-shell GIC mirror system, as described below. Cooling lines 30, input and output sections 34 and 36, secondary manifolds 44 and 46, input and output feeder lines 64 and 66, and input and output main manifolds form a sealed cooling fluid flow path through which a cooling fluid 100 flows in the direction from input main manifold 54 to output main manifold 56. A preferred cooling fluid 100 is water, and more preferably is deionized water. The flow of cooling fluid through cooling lines 30 is described below.

In an example embodiment, securing members 80 are provided on the input and output connecting lines 64 and 66, on input and output manifolds 44 and 46, or at the interface thereof, for securing GIC shell 20 to a stand-off device 250 (introduced and discussed below in connection with FIG. 11 and FIG. 12) that maintains multiple GIC shells in a separated configuration.

Also in an example embodiment, GIC cooling system 10 includes one or more support struts 90 arranged generally perpendicular to cooling lines 30 and that are fixed to the cooling lines on the side opposite GIC shell back surface 22 (see FIG. 1 and FIG. 3). Support struts 90 are configured to maintain cooling lines 30 in a select configuration as GIC cooling system 10 is moved about and ultimately arranged on the GIC shell back surface 22 and thermally contacted thereto, as described below.

Enhanced Thermal Contact of Cooling Fines to GIC Shell

Figure 5A:
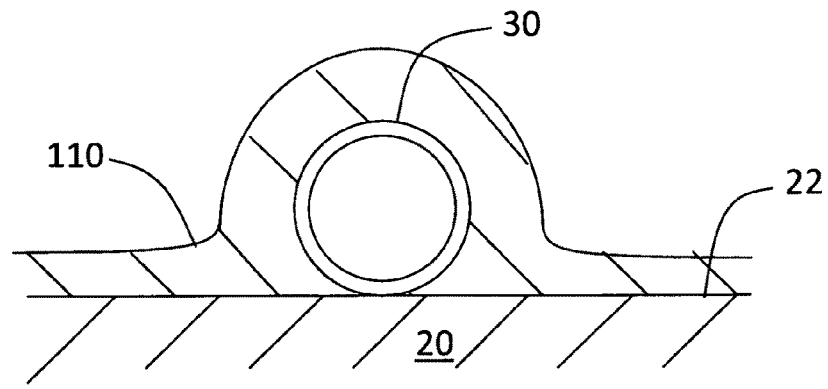
FIG. 5A is a partial cross-sectional view of a GIC shell and a cooling line with a conformal metal layer that enhances thermal contact between the GIC shell and the cooling line.
Figure 5B:
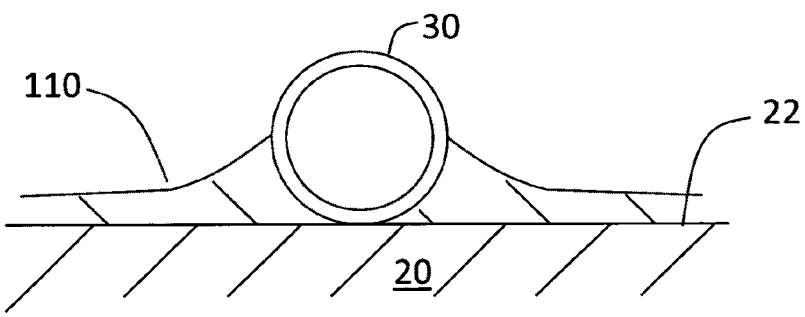
FIG. 5B is similar to FIG. 5A and shows an example where the conformal metal layer only partially covers the cooling line where the cooling line contacts the GIC shell back surface.

Cooling lines 30 need to be in good thermal contact with GIC shell back surface 22 to provide efficient cooling. In one example embodiment illustrated in the partial cross-sectional views of FIG. 5A and FIG. 5B, the thermal contact is enhanced by covering at least a portion of the plurality of cooling lines 30 and the shell back surface 22 with a substantially conformal metal layer 110. FIG. 5A shows cooling line 30 completely covered with conformal metal layer 110. FIG. 5B is similar to FIG. 5A and shows an example where conformal metal layer 110 only partially covers cooling line 30 where the cooling line contacts the GIC shell back surface 22. The conformal metal layer 110 enhances thermal contact between cooling lines 30 and shell back surface 22 because the metal layer provides better thermal conductivity than the air or vacuum that would otherwise occupy the space occupied by the metal layer.

In an example embodiment, conformal metal layer 110 is formed by electroforming cooling lines 30 to GIC shell 20. An added benefit of this electroforming is enhanced structural support of the assembly formed by the cooling system 10 and GIC shell 20.

In an example embodiment, GIC shell 20 is formed as an electroformed shell made of nickel or a nickel alloy, wherein the electroforming process is carried out on a mandrel until the GIC shell reaches a certain thickness (e.g., 1 mm). The GIC shell 20 is left on the mandrel and cooling system 10 (except for the main input and output manifolds 54 and 56) is interfaced with the shell, with cooling lines 30 disposed on back surface 22 as described above. GIC shell 20 can also be formed using other electroformable metals, such as copper, silver and gold, as well as alloys of nickel (e.g., nickel-cobalt) and gold alloys. Nickel and nickel alloys are generally preferred due to their useful inherent material properties.

The entire assembly is then electroformed to form a nickel or nickel alloy metal layer 110 over all or part of cooling lines 30, as shown in FIG. 5A or FIG. 5B. In an example embodiment, metal layer 110 has a general thickness anywhere from 1.5 mm to 4 mm. The entire electroformed assembly is then removed from the mandrel. This final assembly is relatively stiff due to the enhanced structural support provided by metal layer 110.

Cooling lines 30, input and output cooling-fluid manifolds 44 and 46, and input and output feeder lines 64 and 66 preferably have a coefficient of thermal expansion close to that of nickel, or alternately are not themselves very stiff so that some difference in thermal expansion can be accommodated. Exemplary preferred materials for one or more of these components include nickel and nickel alloy, which are compatible with both semiconductor processes and nickel-based electroforming processes.

Cooling Line Density

Figure 6:
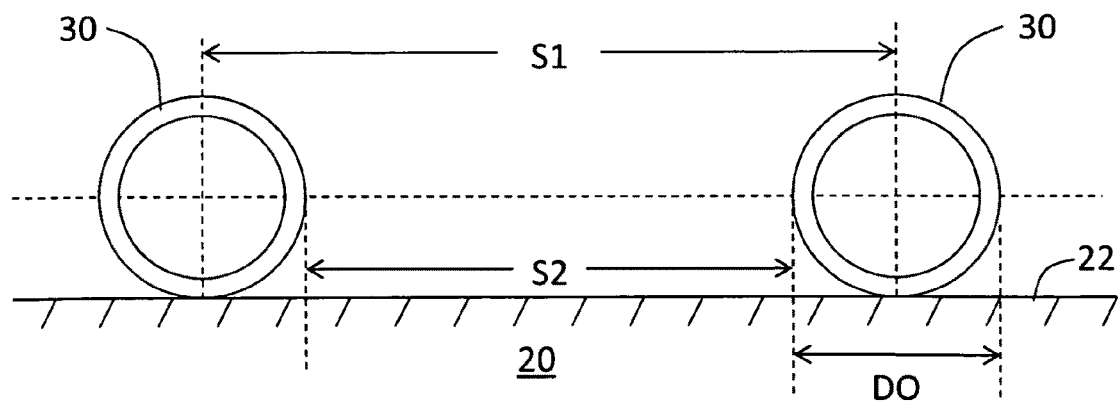
FIG. 6 is a cross-sectional view of two adjacent cooling lines as disposed on the GIC shell back surface, illustrating the relevant dimensions associated with example minimum cooling line spacings.

Generally, it is desirable to have cooling lines 30 be as close to each other as possible. Yet, electric field proximity effects during the electroforming process prevent the cooling lines from being packed too close to one another. FIG. 6 is a cross-sectional view of two adjacent cooling lines 30 as disposed on GIC shell back surface 22. Cooling lines 30 have an outside diameter DO, a center-to-center spacing S1 and an edge-to-edge spacing S2. In an example embodiment that involves electroforming cooling lines 30 to the GIC shell 20, center-to-center spacing S1 of equal to or greater than about 3×DO, and in another example embodiment, edge-to-edge spacing S2 of equal to or greater than about 2×DO, in order to avoid detrimental electric field proximity effects during electroforming. In an even more efficient design, center-to-center spacing S1 is equal to or greater than about 2×DO and edge-to-edge spacing S2 is equal to or greater than about 1×DO.

Cooling Fluid Flow

An improper design of a GIC mirror cooling system can lead to the formation of surface ripples in the GIC shell due to the uneven cooling effects—specifically, local expansion and contraction of the GIC shell caused by thermal gradients. Such surface ripple can cause an expansion and/or distortion of the collector focal spot that can compromise the uniformity of the collected EUV radiation at the GIC mirror focus. An aspect of GIC cooling system 10 is that it reduces the formation of detrimental thermal gradients and the attendant mirror deformations such as surface ripples.

Figure 7:
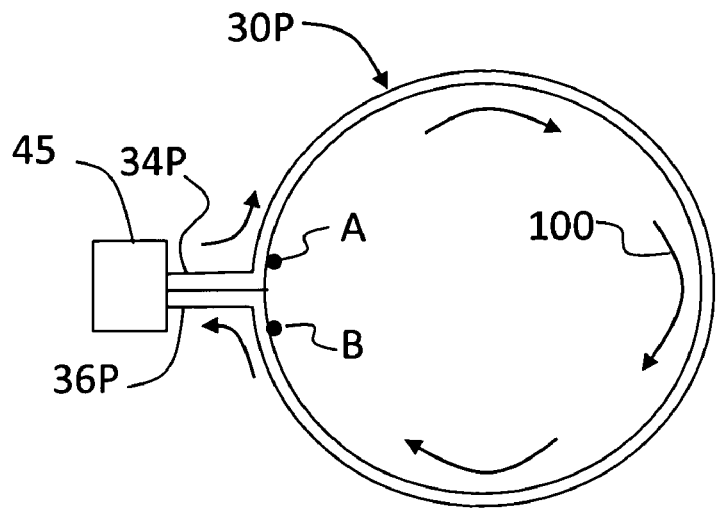
FIG. 7 is a schematic diagram of an example prior art cooling line configuration that has the cooling fluid input and output locations adjacent one another so that the cooling fluid follows a single flow path all the way around the shell circumference, and enter and exits the cooling line at essentially the same location.

FIG. 7 is a schematic diagram of an example prior art cooling line 30P with a configuration having input and output lines 34P and 36P located adjacent one another and connected to a combined input/output cooling-fluid manifold 45. Locations A and B are locations on GIC shell 20 associated with input and output lines 34P and 36P. As the cooling fluid 100 flows from input line 34P, it has a relatively cool initial temperature TA. The cooling fluid 100 is heated as it flows around cooling line 30P due to the thermal contact with the relatively hot GIC shell 20 (not shown; see FIG. 1). The heated cooling fluid 100 with raised temperature TB exits cooling line 30P at output line 36P. The difference in temperature between locations A and is B is defined at ΔTP=TB−TA and represents a thermal gradient between the two locations. This type of thermal gradient can result in the local deformation of the GIC shell 20, which in turn degrades the focusing performance of the GIC shell, i.e., it reduces the GIC shell's ability to focus the collected light.

Figure 8A:
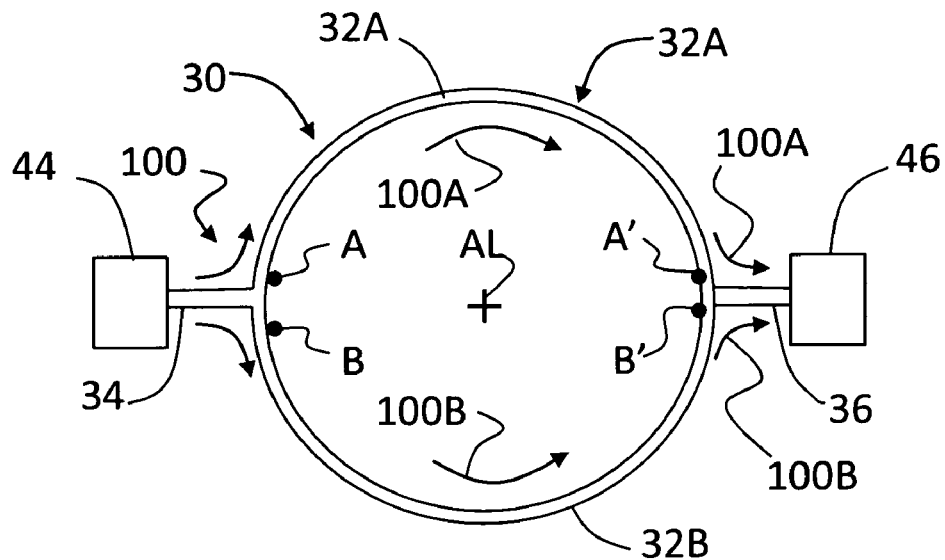
FIG. 8A is similar to FIG. 7, and shows the cooling line configuration of the present invention wherein the cooling fluid input and output lines are located 180° from one another so that the cooling fluid takes two separate semicircular flow paths around GIC shell and enters and exits the cooling line at spaced apart locations.

FIG. 8A is similar to FIG. 7, except it shows the configuration of a cooling line 30 of the present invention, wherein the input and output sections 34 and 36 are located substantially 180° apart. In this configuration, the cooling fluid 100 at temperature TA is provided from input main cooling-fluid manifold 54, up through input feeder line 64 to input cooling-fluid manifold 44 and into input section 34. Cooling fluid divides up at input section 34 such that substantially half of the cooling fluid 100A enters cooling line semicircular section 32A and substantially half of the cooling fluid 100B enters cooling line semicircular section 32B. The two cooling fluid portions 100A and 100B traverse their respective semicircular cooling line sections 32A and 32B and arrive at output line 36 where they are recombined. The recombined cooling fluid 100 then flows through output cooling-fluid manifold 46, through output feeder line 66 and into output main manifold 56. In this configuration, locations A and B are input locations and locations A' and B' are output locations.

Because the flow paths of cooling fluid portions 100A and 100B in cooling lines 30 are substantially symmetrical over GIC shell back surface 22, the two cooling fluids arrive at output section 36 having substantially the same temperature TB. Thus, at input locations A and B, as well as output locations A' and B', the corresponding temperature gradients $\Delta T_{AB}$ and $\Delta T_{A'B'}$ are essentially zero. This serves to preserve the local shape of GIC shell 20 and thus preserve its focusing performance.

Figure 8B:
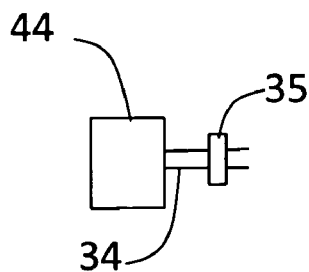
FIG. 8B is a close-up view of the cooling line input section of FIG. 8A, showing an example where the cooling line input section includes a flow-control device for controlling the flow of cooling fluid through the corresponding cooling line.

The cooling line configuration of FIG. 8A also allows for better temperature control because cooling fluid 100 divides up and only flows over respective halves of the circumference of GIC shell 20 for each cooling line 30. In an example embodiment, temperature uniformity over GIC shell 20 is controlled by controlling the flow rate of cooling fluid 100 for each cooling line 30. It is desirable to have moderately turbulent flow of cooling fluid 100 within the cooling lines 30 to maximize the coefficient of thermal exchange between the internal surface of the cooling lines and the cooling fluid. The configuration of cooling lines 30 allows for a relatively high rate of flow because there are two separate flow paths around GIC shell 20. FIG. 8B illustrates an example embodiment where cooling line input section 34 includes a flow-control device 35 (e.g., a flow-control valve) for controlling the flow of cooling fluid in the corresponding cooling line 30. In an example, at least one flow-control device 35 is used to control the flow of cooling fluid 100 in at least one cooling line 30.

Note also that the cooling line configuration of FIG. 8A obviates the need to have a gap between input and output cooling lines that are on the same side of GIC shell 20. Such a gap generally leads to the aforementioned temperature gradient and attendant local shape deformation of GIC shell 20.

Cooling Line Configuration for Segmented GIC Shell

Figure 9A:
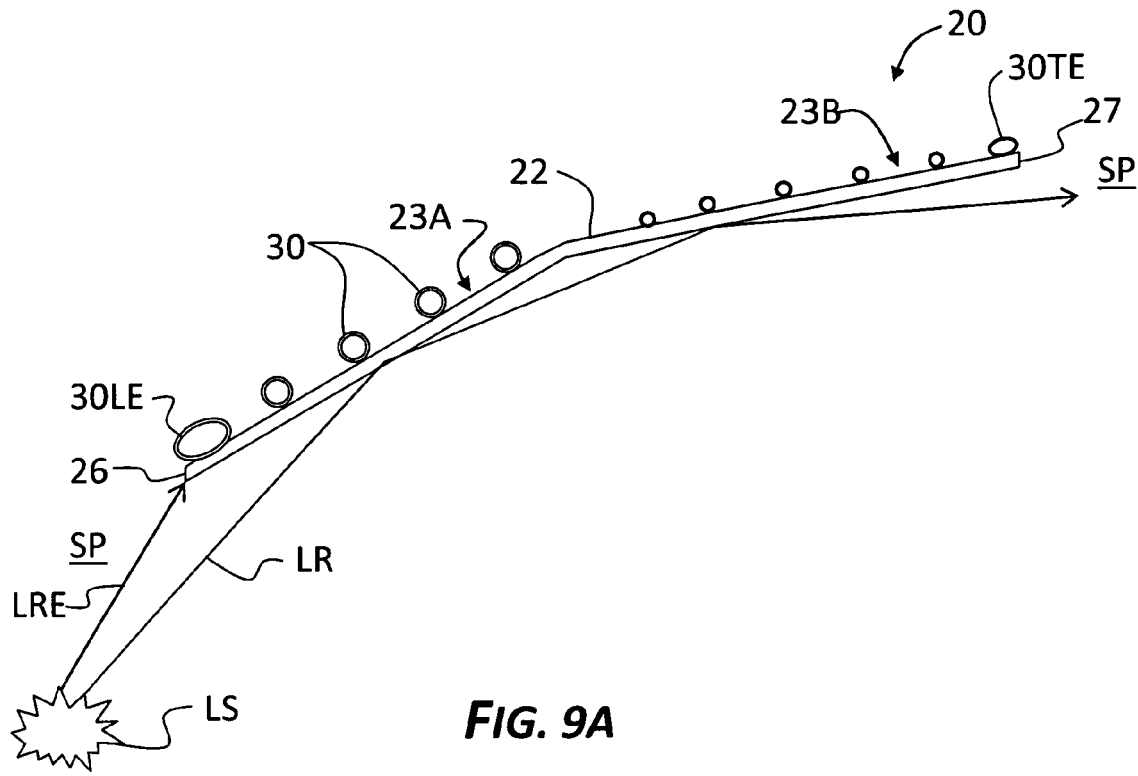
FIG. 9A is a partial cross-sectional view of an example GIC shell having two segments each with different diameter cooling lines due to the different thermal loads for the segments.

FIG. 9A is a partial cross-sectional view of an example GIC shell 20 having two segments 23A and 23B, with a leading edge 26 on segment 23A and a trailing edge 27 on segment 23B. A EUV light source LS that emits light rays LR is shown for the sake of reference. In an example embodiment, the different shell segments 23A and 23B are defined by a discontinuity in the otherwise smoothly varying surface curvature of GIC shell 20. The discontinuity represents the transition between two different mathematical equations (e.g., two different ellipsoidal equations or between an ellipsoidal equation and a hyperboloidal equation) that respectively describe the surface curvature of the two segments. The discussion below is directed to a GIC shell mirror having two segments but is applicable to a GIC shell mirror having only one segment or more than two segments.

GIC shell segments 23A and 23B are arranged so that an EUV light ray LR from EUV light source LS first reflects from segment 23A and then reflects from segment 23B.

Because the first segment is closer to the light source, it is subjected to a greater thermal load than the second segment of the GIC shell 20. Since shell segment 23A experiences a larger thermal load than shell segment 23B, the latter shell segment does not require as much cooling capacity as the former. Thus, cooling lines 30 on the first and second shell segments 23A and 23B are configured to provide respective first and second amounts of thermal cooling that correspond to the first and second thermal loads these shell segments experience in operation. The thermal load generally will vary with distance from EUV light source LS so that the front of the first segment 23A will get more thermal load than the middle of the first segment, etc. Thus, in an example embodiment, cooling lines 30 are also configured to provide varying amounts of thermal cooling over a given shell segment corresponding to the expected thermal load variation over the shell segment.

In an example embodiment of the two-reflection GIC shell 20 shown in FIG. 9A, shell segment 23A includes more cooling capacity than shell section 23B. This involves, for example, using cooling lines 30 with a larger diameter on shell segment 23A than on shell segment 23B. In another example embodiment, shell segment 23A and shell segment 23B include cooling lines having the same diameter except that they are more closely spaced on shell segment 23A than on shell segment 23B, or that there are more cooling lines on shell segment 23A than on shell segment 23B. Also, the diameter of the cooling lines can decrease in size with distance from the light source. Finally, the flow rate of the cooling fluid in each cooling line "ring" 30 can be set to a desired level by means of appropriate orifices or restriction of the cooling-line cross section (e.g., via flow-control device 35 of FIG. 8B) to match the thermal load on the section of the mirror corresponding to the location of the cooling line. Note that in an example embodiment the flow-control device 35 of FIG. 8B can be considered as being located in cooling line 30.

Also in an example embodiment, leading shell edge 26 is provided with an extra large cooling line (labeled "30LE") since this leading edge is closest to EUV light source LS and is heated by light rays LRE as well as particles and plasma from the source. In the absence of cooling line 30LE, leading edge 26 will cool somewhat by radiating some of the absorbed heat into the adjacent space SP, which in operation is a vacuum. This radiative cooling is ineffective as compared to the thermal conduction to bulk portion of GIC shell 20. Such an ineffective radiation-only cooling strategy can lead to a sharp thermal gradient at leading edge 26, which can locally distort GIC shell segment 23A and cause the leading edge shape to distort leading to poor focusing of the EUV radiation.

Note that in the example embodiment shown, cooling line 30LE has an oblate cross section and so has a larger carrying capacity than the other cooling lines 30 of shell segment 23A while also having a reduced profile as compared to a circular-cross-section cooling line with the same fluid carrying capacity.

In an example embodiment, trailing edge 27 is provided with a cooling line 30TE to compensate for the inefficient radiative cooling into surrounding space SP.

Note that when placing a cooling line 30 at a shell edge, there is the risk that the cooling line can block EUV radiation (schematically shown as EUV light rays LR) from reaching the next outer adjacent GIC shell or emerging from the next outer GIC shell in the GIC mirror system. Accordingly, an oblate cross-sectional shape for cooling line 30 is particularly desirable at a front or leading edge location such as leading edge 26 to not block EUV light from reaching the next outer adjacent GIC shell, and trailing edge 27 to not block EUV light emerging from the next outer adjacent GIC shell, as illustrated in FIG. 9A.

Figure 9B:
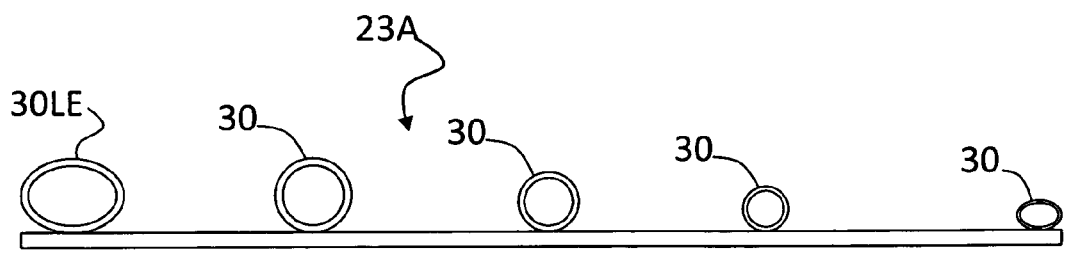
FIG. 9B and FIG. 9C are respective close-up cross-sectional views of the first and second GIC shell segments showing an example of how the cooling lines can vary in diameter and shape within each segment in a manner that corresponds to the thermal load variation over each segment.
Figure 9C:
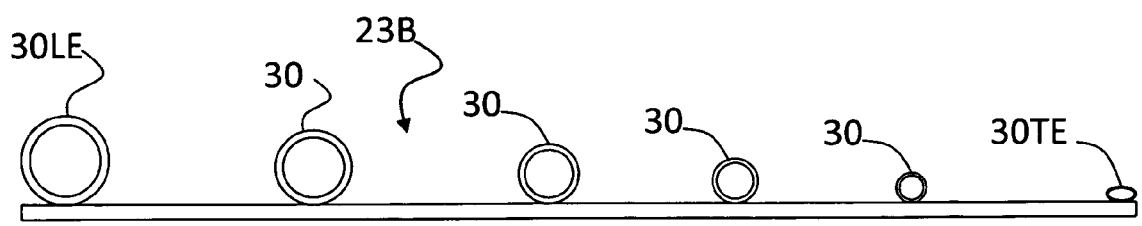

The thermal load on segmented GIC shell 20 can vary over each segment 23A and 23B as well as between segments. Thus, with reference to FIG. 9B and FIG. 9C, cooling lines 30 can vary with diameter and/or spacing over each shell segment 23A and 23B in a manner corresponding to the thermal load variation for the segment.

Forming the Cooling System

Figure 10:
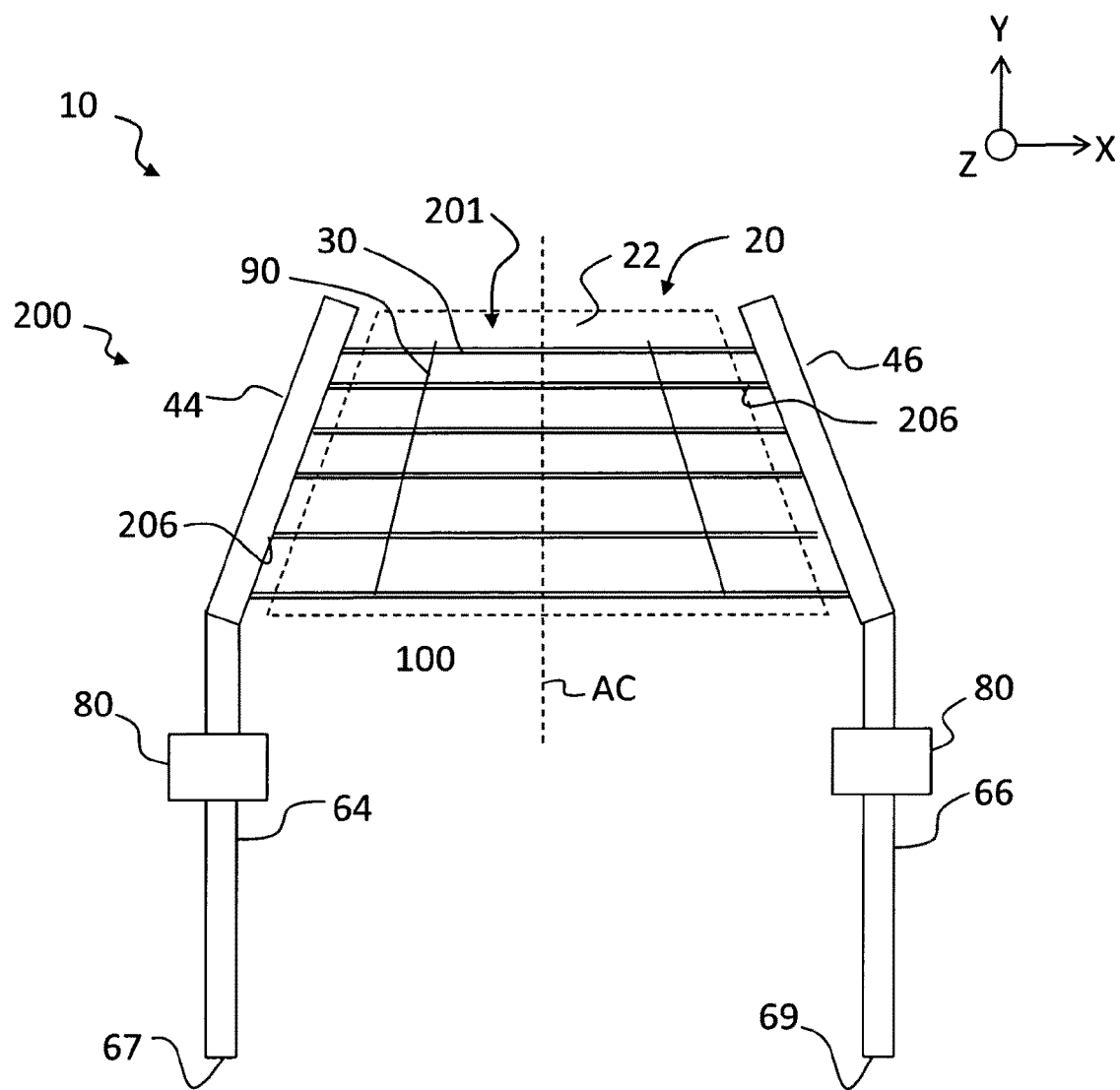
FIG. 10 is similar to FIG. 1 and shows the components of the cooling system that make up a mirror cooling assembly (MCA)

With reference now to FIG. 10, in an example embodiment, a portion of cooling system 10 consisting of cooling lines 30, support struts 90, input and output cooling-fluid manifolds 44 and 46, input and output feeder lines 64 and 66 constitutes a "mirror cooling assembly" or MCA 200 that is formed prior to being interfaced with GIC shell 20. The cooling lines 30 along with support struts 90 constitute a cooling line assembly (CLA) 201. GIC shell 20 is shown in phantom for the sake of illustration. Once MCA 200 is so formed, it is interfaced to GIC shell 20 (including optionally electroformed) with CLA 201 in contact therewith, and then the MCA is connected at input and output feeder line ends 67 and 69 to input and output main cooling-fluid manifolds 54 and 56.

MCA 200 includes a number of connections 206 that need to be vacuum tight. In an example embodiment, connections 206 are formed by brazing. In order to form the brazed connections and also to electroform MCA 200 and GIC shell 20, the MCA needs to be very clean. In an example embodiment, MCA 200 is initially assembled and then put through a cleaning process. In an example embodiment, the cleaning process includes a "green firing" to burn off contaminants such as organics, oils, liquids, dirt, etc. An example green firing process includes subjecting MCA 200 to a temperature of 800° C. in vacuum for 4 hours. At this point, MCA 200 needs to be handled with gloves and other clean environment considerations. The cleaning process may also include, for example, vapor degreasing, ultrasonic cleaning, etc., prior to the green firing step.

At this point, connections 206 are not yet formed. Thus, in an example embodiment, connections 206 are formed to be vacuum tight by forming alloy joints using a hydrogen retort and brazing process. An example of this process includes placing MCA 200 in a vacuum chamber and pumping the chamber down to a suitable vacuum. Hydrogen is added to the chamber, and the chamber interior is brought up to temperature. Because the environment is oxygen-free, no oxygen gets into the joints, which reduces the chances of joint oxidation. The braze material making up the alloyed joints melt and gets wicked into the joints.

The processed MCA 200 is then removed from the vacuum chamber using clean-handling procedures and the MCA is checked for leaks. The clean-handling procedures are continued while MCA is transported to and interfaced with GIC shell 20, which in one embodiment is left on the mandrel on which is was formed to provide structural support during the second electroforming process.

Interfacing MCA 200 with GIC shell 20 includes in one embodiment providing (which includes leaving) the shell on a mandrel, and then the CLA 201 is disposed thereon so that it contacts shell back surface 22. A separation layer is typically used to facilitate the shell removal process. The entire structure—that is, GIC shell 20 and MCA 200 is then electroformed described above. In an example embodiment, GIC shell 20 and MCA 200 are rotated within the electroforming tank (not shown) to enhance the uniformity of the electroforming process.

Once the electroforming process is completed, the electroformed GIC shell 20 along with the attached MCA is then removed from the mandrel. The input and output feeder lines 64 and 66 are then respectively connected to main input and output cooling-fluid manifolds 54 and 56. GIC shell 20 is also coated on its inner surface 21 with a reflective coating (not shown) to improve the mirror reflectivity at the given wavelength and over the range of expected radiation angles.

Figure 11:
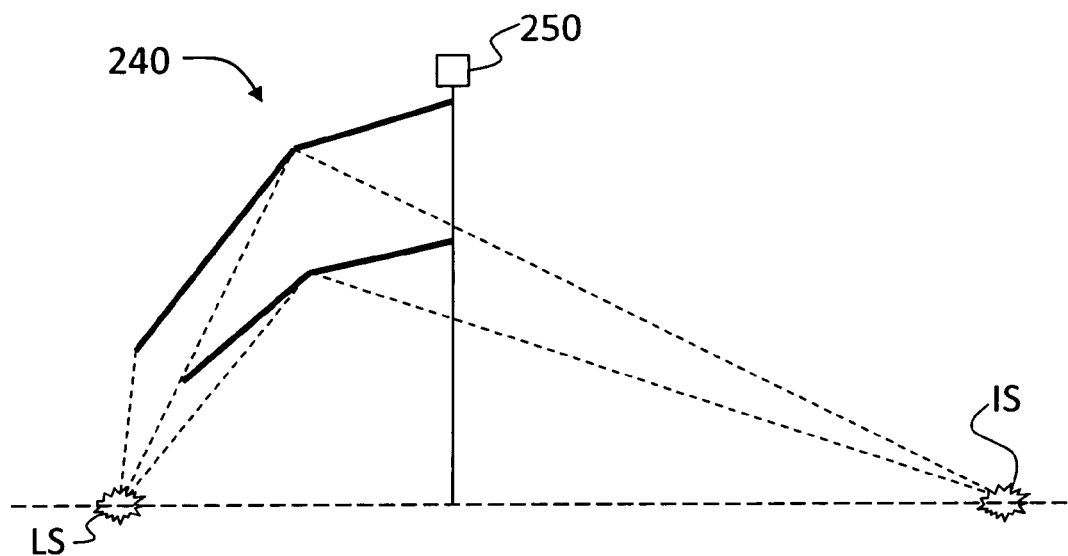
FIG. 11 is a schematic partial view of an example GIC mirror that includes two GIC shells supported in a nested and spaced apart configuration by a stand-off device.
Figure 12:
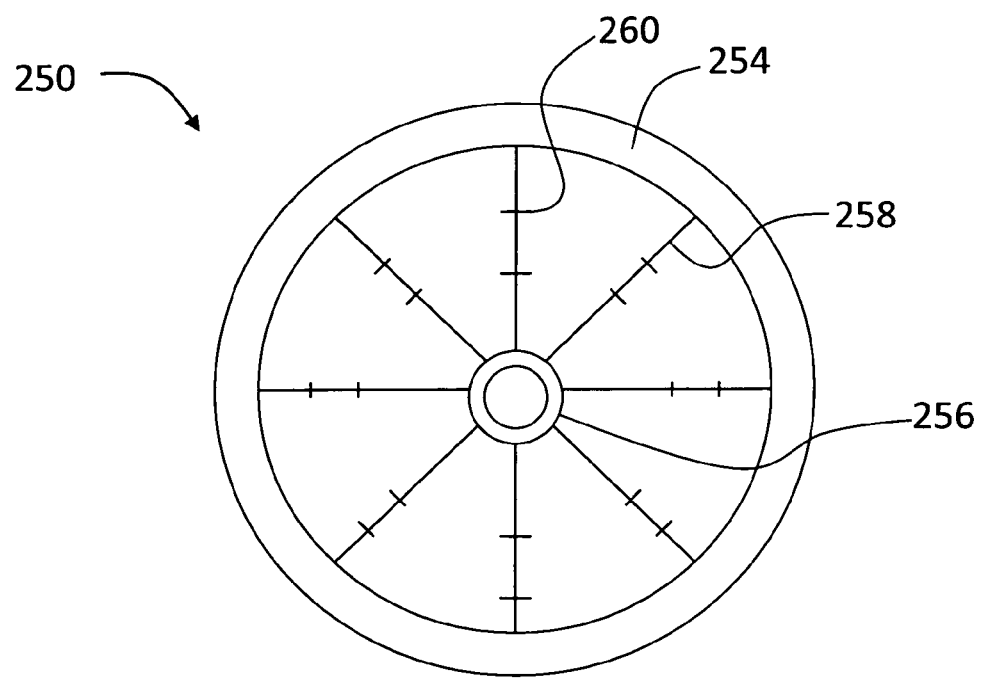
FIG. 12 is a face-on view of an example stand-off device that can be used for the GIC mirror of FIG. 11.

For forming a GIC mirror 240 having multiple GIC shells 20 such as shown in FIG. 11, a stand-off device 250 is used to hold GIC shells 20 in a spaced apart configuration. In an example embodiment, GIC shells 20 are laser welded or epoxied to stand-off device 250. FIG. 12 shows a face-on view of an example stand-off device 250 that has inner and outer circular support rings 254 and 256 and a number of radial spokes 258 connecting the two support rings. Radial spokes 258 include two sets of indents 260 located and sized to accommodate trailing edge 27 of the inner and outer GIC shells 20.

Figure 13:
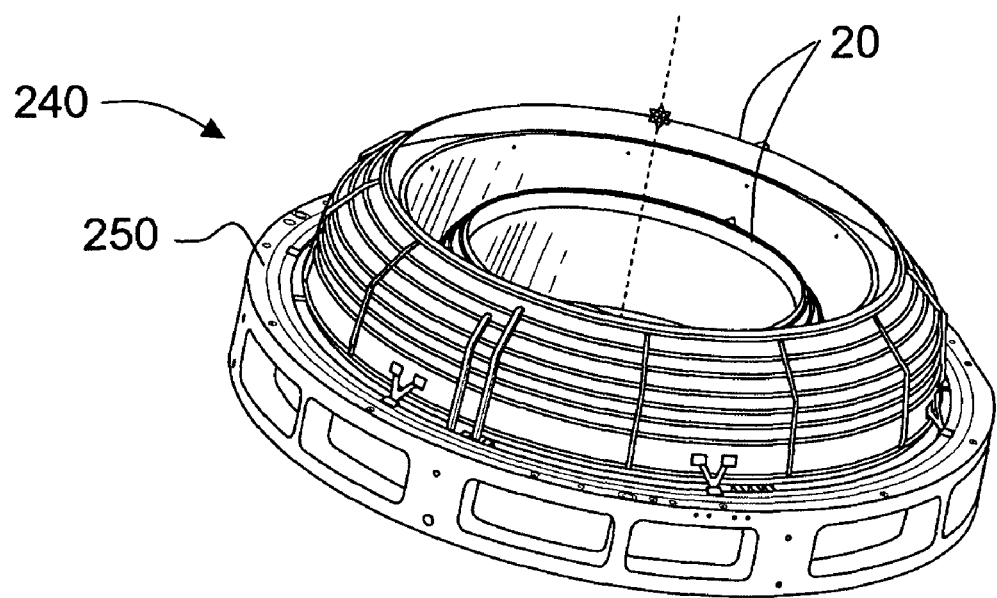
FIG. 13 is a perspective view of an example GIC mirror that includes three GIC shells arranged in a nested configuration and held in place by a stand-off device.
Figure 14:
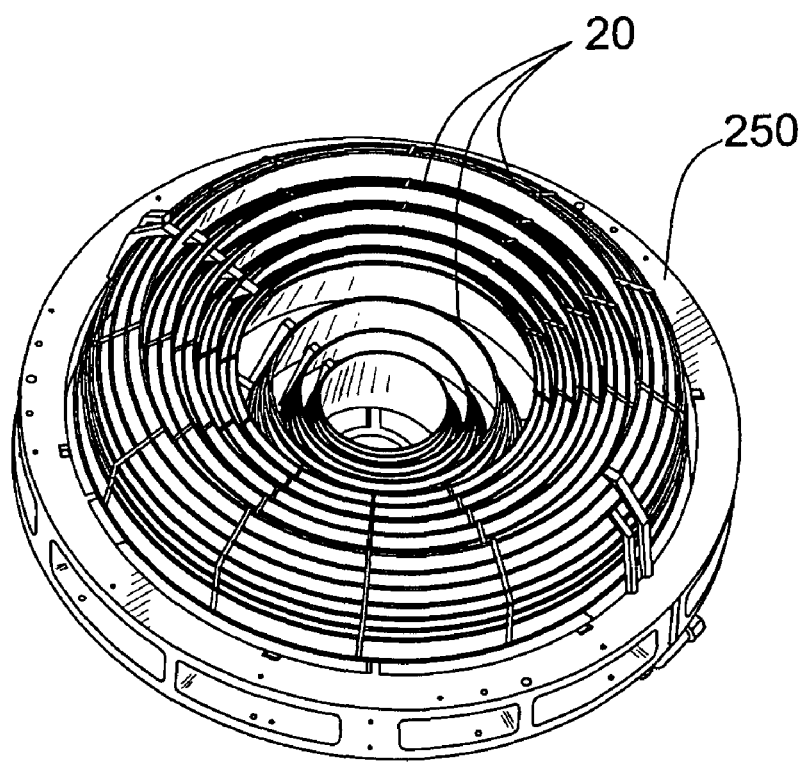
FIG. 14 is a perspective view of an example GIC mirror that includes nine GIC shells arranged in a nested configuration and held in place by a stand-off device.

Once GIC mirror 240 is assembled, then input and output feeder lines 64 and 66 of MCA 200 are connected to input and output main manifolds 54 and 56. FIG. 13 is a perspective view of an example GIC mirror 240 that includes three GIC mirrors 20 arranged in a nested configuration and held in place using a stand-off device 250. FIG. 14 is a perspective view of an example GIC mirror 240 that includes nine GIC mirrors 20 arranged in a nested configuration using a stand-off device 250.

EUV Lithography System with Cooled GIC Mirror

Figure 15:
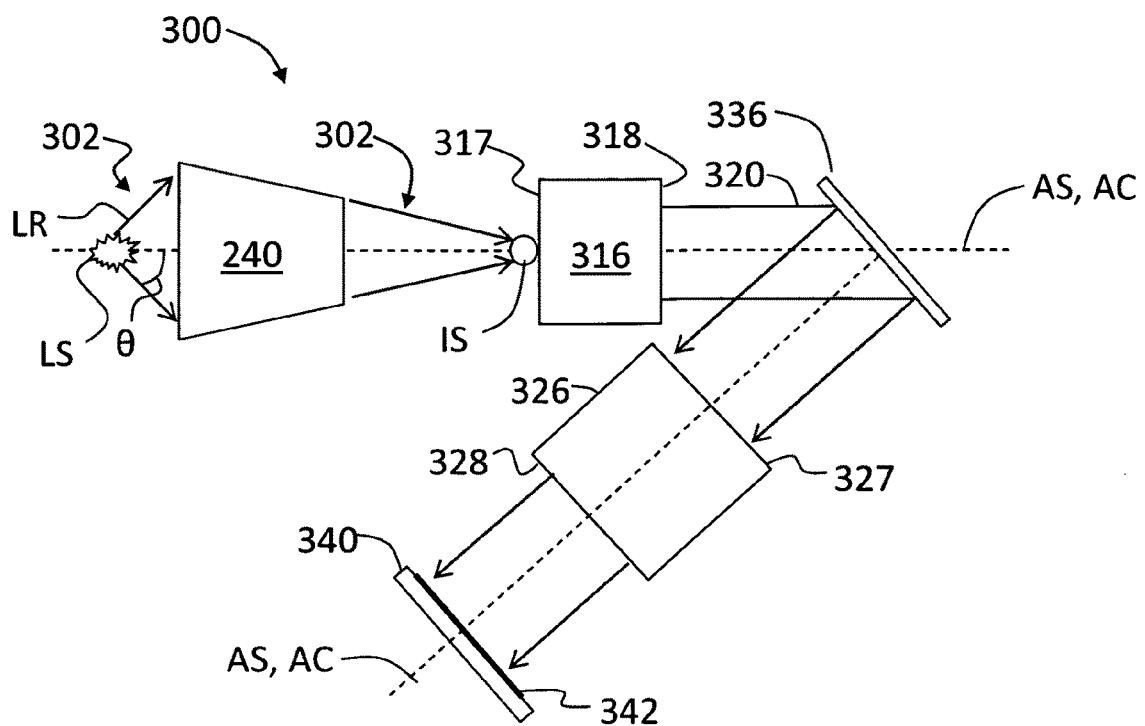
FIG. 15 is a schematic diagram of an EUV lithography system that includes a cooled GIC mirror according to the present invention.

FIG. 15 is an example EUV lithography system ("system") 300 according to the present invention. Example EUV lithography systems are disclosed, for example, in U.S. Patent Applications No. US2004/0265712A1, US2005/0016679A1 and US2005/0155624A1, which Applications are incorporated herein by reference.

System 300 includes a system (optical) axis AS and EUV light source LS, such as a hot plasma source, that emits working EUV radiation 302 at $\lambda$=13.5 nm. EUV radiation 302 is generated, for example, by an electrical discharge source (e.g., a discharged produced plasma, or DPP source), or by a laser beam (laser-produced plasma, or LPP source) on a target of Lithium, Xenon or Tin. EUV radiation 302 emitted from such a LPP source may be roughly isotropic and, in current DPP sources, is limited by the discharge electrodes to a source emission angle of about $\theta$=60° or more from optical axis AS. It is noted that the isotropy of the LPP source will depend on the mass of the target pellet. For relatively high mass targets, the emission is anisotropic, with most of the emerging radiation headed back toward the laser beam due to absorption in the forward direction by the target mass. For a low mass LPP target, which is almost entirely ionized by the laser, the emission is much closer to isotropic.

System 300 includes a cooled EUV GIC mirror 240 such as that described above. EUV GIC mirror 240 is arranged adjacent and downstream of EUV light source LS, with central axis AC lying along system axis AS. EUV GIC mirror 240 collects EUV working radiation 302 (i.e., light rays LR) from EUV light source LS located at a source focus and the collected radiation forms intermediate source image IS at an intermediate focus. An illumination system 316 with an input end 317 and an output end 318 is arranged along system axis AS and adjacent and downstream of EUV GIC mirror 240 with the input end adjacent the EUV GIC mirror. Illumination system 316 receives at input end 317 EUV radiation 302 from source image IS and outputs at output end 318 a substantially uniform EUV radiation beam 320 (i.e., condensed EUV radiation). Where system 300 is a scanning type system, EUV radiation beam 320 is typically formed as a substantially uniform line of EUV radiation at reflective reticle 336 that scans over the reticle.

A projection optical system 326 is arranged along (folded) system axis AS downstream of illumination system 316. Projection optical system 326 has an input end 327 facing illumination system output end 318, and an opposite output end 328. A reflective reticle 336 is arranged adjacent the projection optical system input end 327 and a semiconductor wafer 340 is arranged adjacent projection optical system output end 328. Reticle 336 includes a pattern (not shown) to be transferred to wafer 340, which includes a photosensitive surface in the form of a photosensitive coating (e.g., photoresist layer) 342. In operation, the uniformized EUV radiation beam 320 irradiates reticle 336 and reflects therefrom, and the pattern thereon is imaged onto photosensitive surface (coating) 342 of wafer 340 by projection optical system 326. In a scanning system 300, the reticle image scans over the photosensitive surface to form the pattern over the exposure field. Scanning is typically achieved by moving reticle 336 and wafer 240 in synchrony.

Once the reticle pattern is imaged and recorded on wafer 240, the patterned wafer 340 is then processed using standard photolithographic and semiconductor processing techniques to form integrated circuit (IC) chips.

Note that in general the components of system 300 are shown lying along a common folded axis AS in FIG. 15 for the sake of illustration. One skilled in the art will understand that there is often an offset between entrance and exit axes for the various components such as for illumination system 316 and for projection optical system 326.

It will be apparent to those skilled in the art that various modifications and variations can be made to the present invention without departing from the spirit and scope of the invention. Thus it is intended that the present invention cover the modifications and variations of this invention provided they come within the scope of the appended claims and their equivalents.

What is claimed is:

1. A cooling system for an extreme ultraviolet (EUV) grazing incidence collector (GIC) having at least one shell with a back surface and a central axis, comprising:
    a plurality of spaced apart substantially circular cooling lines arranged in substantially parallel planes that are substantially perpendicular to the shell central axis, the cooling lines thermally contacting and running around a corresponding circumference of the back surface; and
    input and output cooling-fluid manifolds respectively fluidly connected to the plurality of cooling lines at spaced apart input and output locations to flow a cooling fluid from the input cooling-fluid manifold to the output cooling-fluid manifold over two paths for each cooling line.

2. The cooling system of claim 1, wherein the spaced apart input and output locations are arranged substantially 180° apart so that the two paths for each cooling line are substantially semicircular.

3. The system of claim 1, including a conformal metal layer that covers the shell back surface and at least a portion of the plurality of cooling lines.

4. The system of claim 3, wherein the at least one shell is electroformed, and wherein the conformal metal layer comprises an electroformed layer.

5. The system of claim 1, wherein the at least one shell comprises an electroformed metal or metal alloy, and the plurality of cooling lines comprise said metal or metal alloy.

6. The system of claim 1, wherein the plurality of cooling lines have more than one cooling line diameter.

7. The system of claim 1, wherein at least one pair of adjacent cooling lines have an outside diameter DO and are spaced apart from one another by at least one of:
    a) a center-to-center distance of at least about 3×DO; and
    b) a edge-to-edge distance of at least about 2×DO.

8. The system of claim 1, wherein at least one pair of adjacent cooling lines have an outside diameter DO and are spaced apart from one another by at least one of:
    a) a center-to-center distance of at least about 2×DO; and
    b) a edge-to-edge distance of at least about 1×DO.

9. The system of claim 1, wherein at least some of the cooling lines have a non-circular cross-section.

10. The system of claim 1, further comprising a flow-control device adapted to control the flow of cooling fluid through a corresponding cooling line.

11. The system of claim 1, wherein the shell has an edge, and wherein a cooling line is arranged immediately adjacent the edge but without shadowing EUV radiation when the shell is operably arranged relative to an EUV radiation source.

12. The system of claim 1, wherein the edge cooling line has a non-circular cross-section.

13. The cooling system of claim 1, further comprising alloy-brazed connections that fluidly connect the plurality of cooling lines and the input and output cooling-fluid manifolds.

14. The system of claim 1, further comprising:
    a plurality of spaced-apart nested shells each having respective pluralities of cooling lines connected to the input and output cooling-fluid manifolds; and
    a stand-off device configured to maintain the spaced-apart configuration of the nested shells.

15. The system of claim 1, further comprising:
    input and output main cooling-fluid manifolds; and
    input and output feeder lines that respectively connect the input and output cooling-fluid manifolds to the input and output main cooling-fluid manifolds.

16. The system of claim 1, wherein the input and output cooling-fluid manifolds are configured to control a rate of cooling fluid flow to control a temperature difference between the input and output locations of the plurality of cooling lines.

17. The system of claim 1, wherein the GIC shell includes first and second segments that respectively receive first and second thermal loads from an EUV light source, and wherein the cooling lines on the first and second segment are configured to provide respective first and second amounts of thermal cooling corresponding to the first and second thermal loads.

18. The system of claim 17, wherein the cooling lines on the first and second segments are configured to provide varying amounts of thermal cooling corresponding to a variation in thermal load over the respective segments.

19. An extreme ultraviolet (EUV) lithography system for illuminating a reflective mask, comprising:
    a source of EUV radiation;
    a GIC collector having the cooling system of claim 1 and configured to receive the EUV radiation and form collected EUV radiation; and
    an illuminator configured to receive the collected EUV radiation and form condensed EUV radiation for illuminating the reflective reticle.

20. The EUV lithography system of claim 19 for forming a patterned image on a photosensitive semiconductor wafer, further comprising:
    a projection optical system arranged downstream of the reflective reticle and configured to receive reflected EUV radiation from the reflective reticle and form therefrom the patterned image on the photosensitive semiconductor wafer.

21. A method of cooling a grazing-incidence collector (GIC) shell having a back surface and a central axis, comprising:
providing a cooling fluid to a plurality of cooling fluid input locations adjacent the shell back surface; and
guiding the cooling fluid over a portion of the shell back surface via plurality of separate pairs of substantially semicircular paths in substantially parallel planes that are substantially perpendicular to the central axis and in thermal contact with the shell back surface to a corresponding plurality of cooling fluid output locations adjacent the shell back surface and located substantially 180° from the cooling fluid input locations.

22. The method of claim 21, further comprising:
defining the plurality of separate pairs of semicircular cooling fluid flow paths with a corresponding plurality of cooling lines in thermal contact with the shell back surface; and
electroforming the plurality of cooling lines onto the shell back surface.

23. The method of claim 22, wherein at least some of the cooling lines have different diameters.

24. The method of claim 22, including providing at least some of the cooling lines with non-circular cross-sections.

25. The method of claim 22, further comprising controlling the flow of cooling fluid in at least one of the cooling lines using at least one flow-control device.

26. The method of claim 21, further comprising:
providing the cooling fluid to the input locations via an input cooling-fluid manifold; and
collecting the cooling fluid at the output points at an output cooling-fluid manifold.

27. The method of claim 26, further comprising fluidly connecting the cooling lines to the input and output cooling manifolds using a hydrogen retort and brazing process.

28. The method of claim 21, wherein the GIC shell has an edge and further comprising providing at least one pair of semicircular cooling fluid flow paths immediately adjacent the shell edge.

29. A method of forming a cooled, grazing incident collector (GIC) shell having a backside and a central axis, comprising:
providing the shell on a mandrel;
providing a cooling assembly having a plurality of substantially circularly configured cooling lines arranged in substantially parallel planes that are substantially perpendicular to the shell central axis, with each cooling line having a pair of substantially semicircular sections defined by cooling fluid input and output locations;
disposing the cooling assembly such that the cooling lines contact the shell back surface;
electroforming the cooling lines to the shell back surface; and
removing the shell and the attached cooling assembly from the mandrel.

30. The method of claim 29, wherein providing the shell comprises forming the shell by electroforming the shell onto the mandrel, with the mandrel having a separation layer provided thereon to facilitate said removing act.

31. The method of claim 29, wherein providing the cooling assembly includes subjecting the cooling assembly to a firing process that burns off contaminants.

32. The method of claim 29, wherein providing the cooling assembly includes forming alloy joints at the input and output locations using a hydrogen retort and a brazing process.

33. The method of claim 29, further including rotating the cooling assembly and the GIC shell during electroforming.

34. The method of claim 29, further including fluidly connecting the cooling lines to input and output cooling-fluid manifolds using a hydrogen retort and brazing process.

35. A method of collecting extreme ultraviolet (EUV) radiation from an EUV radiation source, comprising:
arranging relative to the EUV radiation source a grazing-incidence collector (GIC) mirror system having at least one GIC shell;
cooling the at least one GIC shell with the cooling method of claim 29; and
using the GIC mirror system to reflect the EUV radiation from the EUV radiation source to an intermediate focus.

* * * * *

UNITED STATES PATENT AND TRADEMARK OFFICE
CERTIFICATE OF CORRECTION

| | | |
|---|---|---|
| PATENT NO. | : 8,153,994 B2 | Page 1 of 1 |
| APPLICATION NO. | : 12/592736 | |
| DATED | : April 10, 2012 | |
| INVENTOR(S) | : Marco Pedrali and Riccardo Ghislanzoni | |

It is certified that error appears in the above-identified patent and that said Letters Patent is hereby corrected as shown below:

Cover Page:

Item (54) and Col. 1, Line 3, in the Title of the Invention, replace the word "Lightography" and insert -- Lithography --

Signed and Sealed this
Twenty-sixth Day of June, 2012

David J. Kappos
*Director of the United States Patent and Trademark Office*